(12) United States Patent
Futatsuyama et al.

(10) Patent No.: US 7,173,862 B2
(45) Date of Patent: Feb. 6, 2007

(54) NON-VOLATILE SEMICONDUCTOR MEMORY DEVICE, METHOD FOR SUB-BLOCK ERASE AND ELECTRIC DEVICE WITH THE SAME

(75) Inventors: Takuya Futatsuyama, Yokohama (JP); Kenichi Imamiya, Tokyo (JP); Koji Hosono, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/138,427

(22) Filed: May 27, 2005

(65) Prior Publication Data

US 2005/0219909 A1 Oct. 6, 2005

Related U.S. Application Data

(62) Division of application No. 10/678,179, filed on Oct. 6, 2003, now Pat. No. 6,903,981.

(30) Foreign Application Priority Data

Jul. 4, 2003 (JP) .............................. 2003-192024

(51) Int. Cl.
*G11C 16/04* (2006.01)

(52) U.S. Cl. ............................ 365/185.33; 365/185.11; 365/185.22

(58) Field of Classification Search ............ 365/185.33
See application file for complete search history.

(56) References Cited

U.S. PATENT DOCUMENTS

| | | | |
|---|---|---|---|
| 5,559,736 A | 9/1996 | Matsukawa et al. | |
| 5,602,789 A | 2/1997 | Endoh et al. | |
| 5,627,782 A | 5/1997 | Tanaka et al. | |
| 5,691,941 A | 11/1997 | Imamiya et al. | |
| 5,754,469 A * | 5/1998 | Hung et al. ............ | 365/185.03 |
| 6,411,548 B1 * | 6/2002 | Sakui et al. ............ | 365/185.17 |

FOREIGN PATENT DOCUMENTS

| | | |
|---|---|---|
| JP | 7-287989 | 10/1995 |
| JP | 8-153398 | 6/1996 |

\* cited by examiner

*Primary Examiner*—Thong Q. Le
(74) *Attorney, Agent, or Firm*—Oblon, Spivak, McClelland, Maier & Neustadt, P.C.

(57) ABSTRACT

After execution of sub-block erase (S2) for partly erasing a memory cell block, sub-block erase verify read is executed (S4). As a result of the sub-block erase verify read, if the sub-block erase is completed, then terminate the sub-block erase (S5). If otherwise the sub-block erase is not completed yet, then perform over-program verify read (S6) to thereby determine whether the cause of an event that a sub-block erase-verify result becomes "Fail" due to the deficiency of erase or the presence of an over-programmed cell or cells. If the result of such over-program verify read is "Pass," then repeat execution of the sub-block erase verify read (S2). When the over-program verify read (S6) is "Fail," output a Fail result and then complete the operation (S8).

8 Claims, 12 Drawing Sheets

[Program]

[Erase]

[Read]

[Erase Verify Read]

[Sub-Block Erase]

[Sub-Block Erase Verify Read]

[Over-Program Verify Read]

[During Erase]

[During Write]

[Cell Array Threshold Voltage Distribution]

US 7,173,862 B2

NON-VOLATILE SEMICONDUCTOR MEMORY DEVICE, METHOD FOR SUB-BLOCK ERASE AND ELECTRIC DEVICE WITH THE SAME

CROSS-REFERENCE TO RELATED APPLICATION

This application is a division of and claims the benefit of priority under 35 USC §120 from U.S. application Ser. No. 10/678,179, filed Oct. 6, 2003 now U.S. Pat. No. 6,903,981 and is based on and claims the benefit of priority under 35 USC §119 from Japanese Patent Application No. 2003-192024, filed on Jul. 4, 2003, the entire contents of which are incorporated herein by reference.

BACKGROUND OF THE INVENTION

1. Field of the Invention

The present invention relates generally to non-volatile semiconductor memory devices such as flash memory chips of the NAND type, and more particularly to sub-block erase methodology for use therewith.

2. Description of the Related Art

NAND-type flash memory chips are widely used as file storage memories, which in turn are for use as recording media of music data and image data. As the music data and image data are larger in file size, NAND flash memories also increase in storage capacity, resulting in a likewise increase in storage capacity of a unitary portion for a write (page) and an erase unit (block) of NAND flash memories. Generally one block of NAND flash memory is an ensemble of multiple pages so that the block capacity becomes several times greater than the capacity of a page. As the block capacity becomes larger in the way stated above, the resultant efficiency becomes inferior in the case of erasing or rewriting a small capacity of data.

To avoid this problem, an operation scheme for erasing only part of the block capacity (sub-block erase) has been proposed (U.S. Pat. No. 5,293,337 and U.S. Pat. No. 5,402,373). This sub-block erase is a scheme for erasing a portion of the block capacity in units of page capacities and thus is a scheme for efficiently erasing or rewriting a small amount of data.

An explanation will be given of a block erase operation, sub-block erase operation, and write operation of a NAND flash memory below.

FIG. 11 shows an extracted portion of a memory cell array of NAND flash memory chip. The memory cell array has a plurality of cell array blocks BLK and BLK', and each block BLK, BLK' includes a plurality of NAND cell units NU, which correspond in number to bit lines BL0, BL1, . . . , BLj. One NAND cell unit NU in the NAND flash memory is made up of two select gate transistors S1 and S2, and memory cells MC0 to MCi which are connected in series between these select gate transistors S1, S2. A source of the select gate transistor S1 is connected to a source line CELSRC, while a drain of the select gate transistor S2 is connected to a corresponding one of the bit lines BL0 to BLj. Select gates of the select gate transistors S1, S2 and control gates of memory cells MC0-MCi are commonly connected in a row direction by select gate lines SGS, SGD and word lines WL0 to WLi, respectively.

Note here that a unitary portion for write—say, write unit—of the memory cell array is an ensemble (page) of memory cells MC which are queued in a column direction while these are connected together to a single word line WL. In contrast, an erase unit is as follows: in the case of prior known block erase, the erase unit is an ensemble EU of all the memory cells MC within a cell array block BLK; in the case of sub-block erase, an erase operation is done on a per-page basis in a similar way to the write unit.

FIGS. 12A and 12B show cross-sectional views of one memory cell MC of the NAND flash memory, and FIG. 12C is a threshold voltage distribution pattern thereof. As shown in FIG. 12A, in the case of erasing data of the memory cell MC, let a control gate (word line) 510 be applied to ground, and potentially raise or "boost" a well region 513 of the cell up to an erase voltage (e.g. 20V). Whereby, a junction of source/drain 512 becomes forward-biased and thus boosted so that a high electric field is applied between a floating gate 511 for use as a carrier storage layer and the cell's well 513, causing electrons to be drawn out of the floating gate 511. This results in a decrease in threshold voltage of the memory cell.

On the other hand, an operation for writing data into the memory cell MC is as follows. As shown in FIG. 12B, apply the cell's well 513 and source/drain 512 to ground, and potentially boost the control gate 510 to a write voltage (e.g. 20V). Apply an intermediate voltage (10V) to the control gates of all the other memory cells which are series-connected to this memory cell, and give a data voltage of 0V to a bit line associated therewith. With such voltage application, a channel is formed between the source and drain of the memory cell, and a high electric field is applied between the floating gate 511 and the channel, causing electrons within the channel to be injected onto floating gate 511. A result of this electron injection is that the memory cell increases in threshold voltage.

FIG. 12C shows a typical threshold voltage distribution of the memory cell. Suppose that a state with data being written into the memory cell is a logic "0" data, whereas an erased state is a logic "1" data. An erased cell is in the state that its threshold voltage Vth is negative whereas a written or "programmed" cell is such that its threshold voltage Vth is positive and is greater than or equal to VvO and yet less than a read voltage Vread.

Here, when erasing by conventional block erase techniques the data of those memory cells of the cell array shown in FIG. 11 which are connected to word lines WL0–WL3, an operation will be performed in a routine which follows.

(1) In the block BLK, read data of a memory cell MC4 that is connected to a word line WL4 and then transfer and save the read data to a memory cell MC4' of another block BLK', which cell is connected to the word line WL4.

(2) Regarding memory cells MC5 to MCi of the block BLK which are connected to word lines WL5-WLi, perform data transfer/saving to the block BLK' in a way similar to the step (1).

(3) Erase the block BLK.

When rewriting or "re-programming" the data of the memory cells MC0–MC3, first perform the operation at the step (1) to (3) and thereafter write data bits into memory cells MC0–MC3, respectively.

Note here that in the case of a NAND flash memory with its block capacity of 128 kilobytes (kB) and page capacity of 2 kB, a NAND cell unit NU is such that thirty two (32) memory cells MC0–MC31 are series-connected. Accordingly, in the case of performing the above-noted steps (1) to (3), the intended operation is completed only after the read operation is recurrently performed for twenty eight (28) times and the write is repeated 28 times at the steps (1) and (2) and then the erase is done for one time. This approach must be low in efficiency.

Alternatively, using a sub-block erase technique makes it possible to perform the required operation for erasing data of the memory cells MC0–MC3 as connected to the word lines WL0–WL3 in a way which follows.

(1) Erase the data of memory cells MC0–MC3 that are connected to the word lines WL0–WL3 (i.e., sub-block erase).

In other words, the intended operation is completed by mere execution of a single step of erase operation.

When rewriting the data of memory cells MC0–MC3, first perform the step (1), and thereafter write data bits into the memory cells MC0–MC3, respectively.

As stated above, use of the sub-block erase technique makes it possible to easily achieve erase and rewrite of small-capacity data.

As apparent from the foregoing, whereas the block erase operation is inherently designed to erase data of all the memory cells within a NAND cell unit at a time in a way known as the "all-at-once" erase, the sub-block erase scheme enables only the data of a selected memory cell or cells which is/are part of such NAND cell unit while permitting data of the remaining memory cells to be retained with no changes. However, in the case of the sub-block erase, it becomes possible to repeat again and again the execution of erase and data write with respect to any given cell of the NAND cell unit, almost unlimitedly in execution number. In other words, any limitation disappears in the erase execution number and data write execution number in a given block. Due to this, in cases where erase/write is recurrently performed only with respect to a specific page within a presently selected block, the intermediate voltage (10V) must be iteratively applied to the control gates in those pages other than a specified page within such selected block. This would cause the threshold voltage of the pages that are not to be rewritten to gradually shift or offset toward the positive potential direction, resulting in the risk of unwanted occurrence of over-programmed cells.

More specifically, assuming that data has already been written into the memory cell MC0 of FIG. 11, in the case of prior art block erase schemes, the number of times that the intermediate voltage (10V) is applied to the gate of memory cell MC0 is equal to the number of times that data is written into all the other memory cells MC1-MCi within the block. In contrast, in the case of using the sub-block erase method, data erase and write on a per-sub-block basis are still possible even after all the memory cells MC0-MCi have been written data; thus, the number of times that the intermediate voltage is applied to the gate of any given cell is equal to a total sum of the number of times in the case of block erase and the number of times that sub-block erased memory cells are written or "programmed." In case specific setting is made to enable the sub-block erase to be repeated without any limitation in execution number, the time period for application of the intermediate voltage becomes almost unlimited.

As the total sum of time periods for applying the intermediate voltage to the control gates of those memory cells that are not to be written becomes longer, the memory cells become higher in threshold voltage Vth accordingly; thus, if the memory cell of interest is an erased cell ("1" data cell) then this cell can change to a "0" data cell in some cases, although the possibility of such state change or transition stays extremely low. If this is the case, an error correcting circuit external to the flash memory chip is employable to perform decoding. Unfortunately it may be contemplated that if the memory cell is a data written cell ("0" data cell) then this cell's threshold voltage Vth gets higher in potential than the read voltage Vread shown in FIG. 12C, although the possibility is extremely low. When the threshold voltage Vth of such memory cell becomes higher than the read voltage Vread, it is no longer possible to read data out of every memory cell of the NAND cell unit to which such memory cell belongs.

Consequently, in the event that a sub-block erase verify read session is ended with a result of failure to complete the intended erase successfully, two reasons for explanation of such result are considered: one reason is that the cell being erased fails to be fully erased; the other is that within the NAND cell unit to which the erased cell belongs, more than one cell with its threshold voltage Vth higher than Vread (i.e. over-programmed cell) must be present in those cells that are not to be erased. However, with the prior art verify read and sub-block verify read schemes, even when the result that the erase is not completed yet is obtained, it is still impossible to determine this result is due to which one of the two causes. Thus the resulting sub-block erase time period (erase loop execution number) becomes longer, which requires extra application of the erase voltage high in potential to the NAND flash memory. This would result in the to-be-erased cell being erased excessively or "over-erased," which in turn leads to the risk that the cell's threshold voltage distribution becomes wider undesirably.

BRIEF SUMMARY OF THE INVENTION

In accordance with one aspect of the present invention, a sub-block erase method for use in a non-volatile semiconductor memory device is provided. The nonvolatile semiconductor memory device includes a matrix of rows and columns of memory cells organized into more than one cell array block. Each memory cell has a charge storage layer and a control gate stacked over each other through an insulative film above a semiconductor substrate and is set in any one of a write state with electrons injected into the charge storage layer and an erase state with electrons drawn out of the charge storage layer. The control gates of a plurality of memory cells aligned in a row direction are commonly connected together by a word line. A plurality of memory cells queued in a column direction are connected together by a bit line to thereby constitute a NAND cell unit. The method is for erasing more than one partial memory cell of the cell array block. This method includes the steps of: performing sub-block erase by giving to a control gate of the partial memory cell being an object to be erased a voltage for drawing electrons out of the charge storage layer; performing sub-block erase verify read for checking whether the memory cell to be erased is set in the erase state; performing over-program verify read to check whether an over-programmed memory cell having its threshold voltage higher than a read voltage is present within the NAND cell unit; when the sub-block erase verify read results in failure to make certain that the memory cell is in the erase state and when the over-programmed memory cell is absent, determining whether an execution number of the sub-block erase reaches a predefined allowable number and then permitting re-execution of the sub-block erase if the execution number does not reach the allowable number or, alternatively, terminating the processing while regarding the erase as being inexecutable if the execution number reaches the allowable number; determining the erase is completed to thereby terminate the processing when the memory cell to be erased becomes in the erase state during the sub-block erase verify read; and determining the erase is inexecutable to thereby terminate the processing when an over-programmed memory cell is found to be present by the over-program verify read.

In accordance with another aspect of the invention, a nonvolatile semiconductor memory device is provided. This memory device includes a memory cell array with a matrix of rows and columns of memory cells organized into more than one cell array block. Each memory cell has a charge storage layer and a control gate stacked over each other through an insulative film above a semiconductor substrate and is set in any one of a write state with electrons injected into the charge storage layer and an erase state with electrons drawn out of the charge storage layer. The control gates of a plurality of memory cells aligned in a row direction are commonly connected together by a word line. A plurality of memory cells queued in a column direction are connected together by a bit line to thereby constitute a NAND cell unit. The memory device also includes a control unit which is operable to apply to this memory cell array certain voltages for execution of write and read of the memory cell and also of sub-block erase for erasing more than one partial memory cell of the cell array block. This controller has functions of: performing sub-block erase by giving to a control gate of the partial memory cell being an object to be erased a voltage for drawing electrons out of the charge storage layer; performing sub-block erase verify read to check whether the memory cell to be erased is set in the erase state; performing over-program verify read to check whether an over-programmed memory cell having its threshold voltage higher than a read voltage is present within the NAND cell unit; determining, when the sub-block erase verify read results in failure to make certain that the memory cell is in the erase state and when the over-programmed memory cell is absent, whether an execution number of the sub-block erase reaches a predefined allowable number and then permitting re-execution of the sub-block erase if the execution number does not reach the allowable number or alternatively terminating the processing while regarding the erase as being inexecutable if the execution number reaches the allowable number; determining the erase is completed to thereby terminate the processing when the memory cell to be erased becomes in the erase state during the sub-block erase verify read; and determining the erase is inexecutable to thereby terminate the processing when an over-programmed memory cell is found to be present by the over-program verify read.

BRIEF DESCRIPTION OF THE DRAWINGS

The present invention will be more fully understood from the following detailed description with reference to the accompanying drawings, in which.

DETAILED DESCRIPTION OF THE INVENTION

Embodiments of this invention will be explained with reference to the accompanying drawings below.

Figure 1:
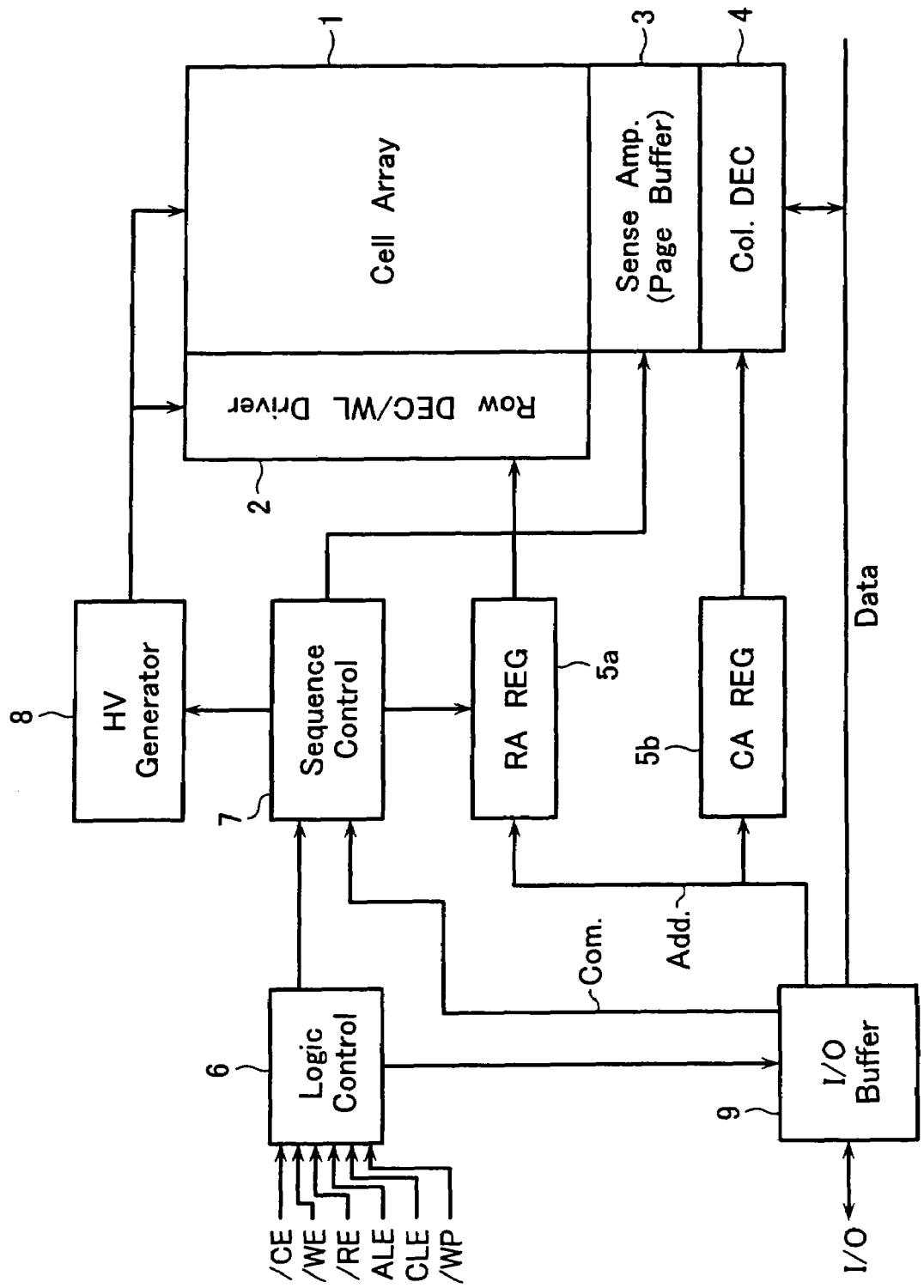
FIG. 1 is a block diagram showing a configuration of a flash memory of the NAND type in accordance with one embodiment of the present invention.

FIG. 1 is a functional block diagram of an electrically erasable programmable read only memory (EEPROM) chip of the NAND type, called a NAND flash memory, in accordance with an embodiment of this invention. A memory cell array 1 is configured from a plurality of floating gate type memory cells, which are organized into a matrix of rows and columns. A row decoder (including a word line driver) 2 is operable to perform block selection of the cell array 1 and also perform selective driving of word lines and select gate lines. A sense amplifier circuit 3 includes sense amplifiers which correspond, in number, to a "page" of data bits and are operable to detect or sense data of bit lines of the cell array 1, thereby to constitute a page buffer.

A page of read data is selected by a column decoder (column gate) 4 and then output to an external input/output (I/O) terminal through an I/O buffer 9. Connected to the external I/O terminal is an error correction circuit, not shown, by way of example. Optionally the error correction circuit may be mounted or "embedded" within the chip. Write data being supplied from the I/O terminal is input through the I/O buffer 9 to the column decoder 4 and then loaded into the sense amplifier circuit 3 after selection by the column decoder 4. An address signal Add is input via the I/O buffer 9 so that row and column addresses are transferred to a row address register 5a and a column address register 5b, respectively.

A logic controller 6 is operatively responsive to receipt of control signals including but not limited to a write enable signal WE(Bar) or "/WE," read enable signal /RE, address latch enable signal ALE, and command latch enable signal CLE. The logic controller 6 outputs, based on such control signals received, chip-inside or internal timing signals for use during read, write and erase operations. A sequence controller 7 is provided to perform sequence control for data write and erase based on these timing signals and also perform data read operation control. A high voltage generating circuit 8 is controlled by the sequence controller 7 to generate various kinds of high voltages for use during data write and erase sessions. These controllers 6, 7 and high voltage generator circuit 8 make up the control means as claimed.

Figure 2:
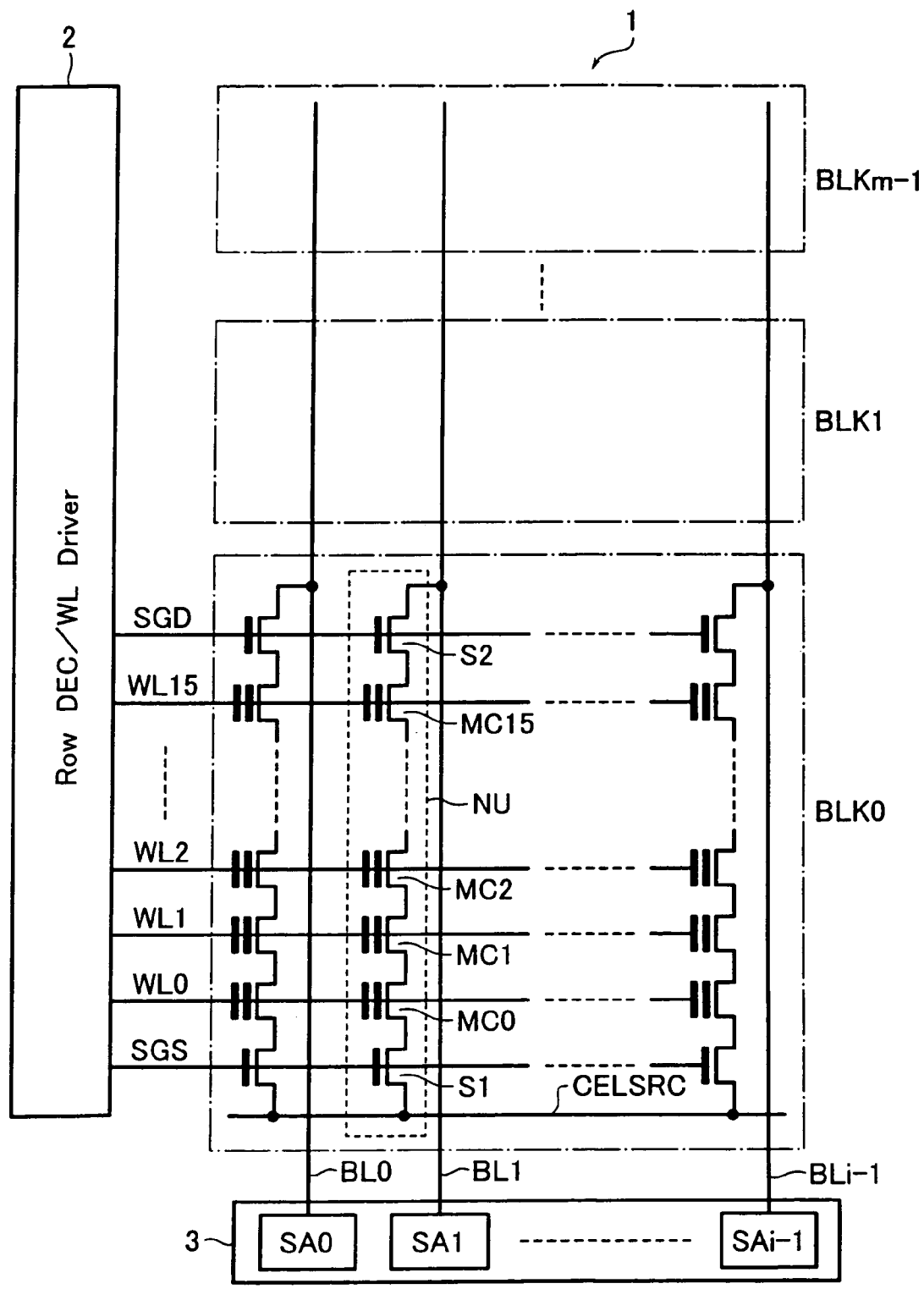
FIG. 2 is a circuit diagram showing a configuration of main part of a memory cell array in the flash memory of FIG. 1.

On a practical memory chip, the cell array 1 is made up of a plurality of cell array blocks which are physically independent of one another. FIG. 2 shows an example with m cell array blocks BLKi (i=0, 1, 2, . . . , m-1) laid out therein. Each cell array block BLKi has a plurality of mutually crossing word lines WL and bit lines BL. The bit lines BL are provided and railed to extend over all the cell blocks BLKi. A memory cell MC is provided at a cross point or intersection between each word line WL and bit line BL. A plurality of (e.g. sixteen in the illustrative example) floating gate type memory cells MC0 to MC15 are connected in series together to thereby constitute a cell string. A select gate transistor S1 is inserted between the source of a cell on one end side of the cell string and a common source line CELSRC; a select gate transistor S2 is inserted between the drain of a cell on the opposite end side and a bit line BL. A single cell string and two select transistors that are connected to the opposite ends of the cell string make up a NAND cell unit NU.

A respective one of the memory cells MC0 to MC15 has its control gate which is connected to a corresponding one of the word lines WL0 to WL15. The select gate transistors S1, S2 have their select gates which are connected to select gate lines SGS, SGD that are provided in parallel to the word lines WL, respectively. An ensemble or "cluster" of multiple memory cells MC along a single word line WL becomes a page, which is for use as a unitary portion for data read and write, i.e., a read unit and write unit. As previously stated, a group of several NAND cell units which are aligned in the word-line WL direction becomes a unit for data erase in the case of block erase. Alternatively in the case of sub-block erase, one or a plurality of pages is/are for use as the unit of data erase.

An explanation will next be given of a write, erase, read operation along with other various kinds of verify read operations of the NAND flash memory thus arranged in the way stated above.

(1) Data Writing to Memory Cell

Figure 3A:
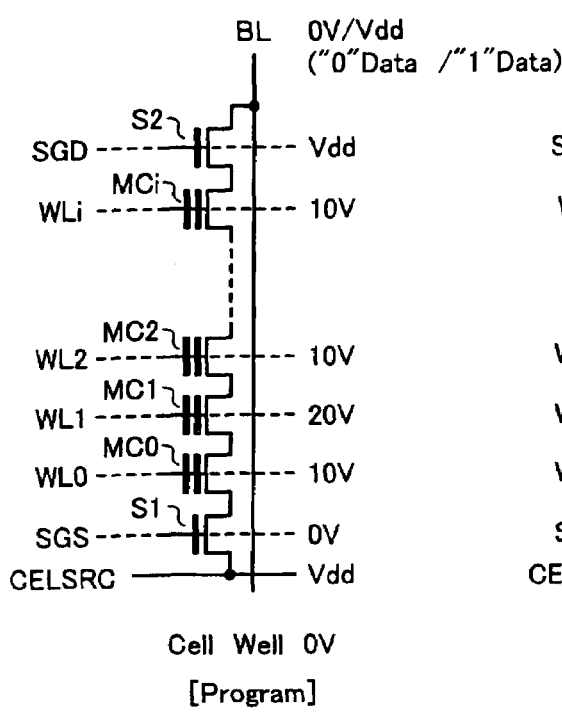
FIGS. 3A to 3D are diagrams showing voltage application patterns during writing, block-erasing, reading, and block-erase verify reading of the flash memory, respectively.

There is shown in FIG. 3A certain criteria for voltage application to a NAND cell unit NU during data writing to a memory cell. Note here that an example is shown for writing data into a memory cell MC1. At the time of data writing, apply a high voltage Vpp (of approximately 20V) to the control gate of the memory cell MC1 to which data is to be written, while applying an intermediate or "middle" voltage VppM (of about 10V) to the control gates of the other memory cells MC0, MC2, MC3, . . . , MCi. In addition, give the ground potential to the select gate line SGS on the source line CELSRC side, and apply a power supply voltage Vdd to the select gate line SGD on the bit line BL side. And, apply either the middle voltage VppM or supply voltage Vdd to the bit line BL in the case of retaining a logic "1" data; in the case of "0" data writing, give a 0-V voltage thereto. Apply either the mid voltage VppM or supply voltage Vdd to the source line CELSRC.

A potential of the bit line BL is transferred to the selected memory cell MC1's drain through the select gate transistor S2 and non-selected memory cells MCi, . . . , MC2. When 0V is given to the bitline BL (i.e., when write data is present, that is, at the time of "0" data), its potential is sent to the drain of the selected memory cell MC1 so that a high electric field is applied between the gate and drain of selected memory cell MC1, resulting in electrons being injected by tunneling—namely, tunnel-injected—from the drain (substrate) onto the floating gate. Whereby, the threshold voltage Vth of selected memory cell MC1 shifts to the positive direction. On the other hand, when the middle voltage VppM is given to the bitline BL (i.e. when there is no data to be written, in other words, at the time of "1" data), electron injection hardly occurs, causing the threshold voltage Vth to be kept unchanged and thus stay negative in polarity.

(2) Memory Cell Block Erasing

Figure 3B:
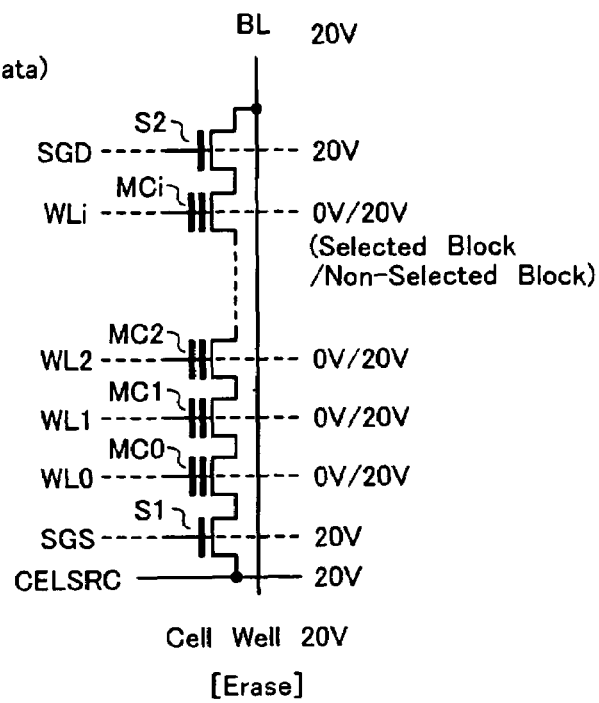

See FIG. 3B, which shows the criteria for voltage application to the NAND cell unit NU during block erasing. At the time of erasing all data bits within a presently selected block BLK, give the ground potential to the control gates of all the memory cells MC0 to MCi within the selected block, and apply a high potential erase voltage (of about 20V) to cell's well while at the same time setting in an electrically floating state the control gates of all memory cells within non-selected blocks and all the select gate lines SGS, SGD, bit lines BL and source lines CELSRC of all the blocks involved. With such voltage application, the electrons that have been held at the floating gates of certain memory cells of the selected block are drawn out into the well. Thus, per-block erase is performed. At this time, all the control gates within nonselected blocks and all the select gate lines, bit lines and source lines within all the blocks also increase in potential up to the erase voltage or its nearby level due to the presence of capacitive coupling (for example, in the case of a select gate line, capacitive coupling of the gate capacitance of a select gate transistor and a capacitance between the select gate line and ground).

(3) Data Reading from Memory Cell

Figure 3C:
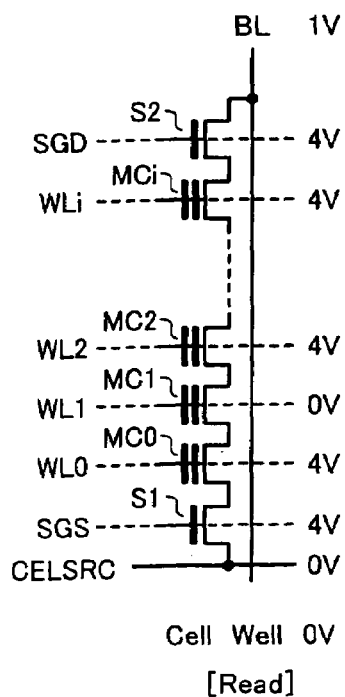

FIG. 3C shows the criteria for voltage application at the time of reading the NAND cell unit NU. When reading data out of the memory cell MC1, set the control gate of selected memory cell MC1 at 0V, and set the control gates of the remaining memory cells MC0, MC2, . . . , MCi and the select gate at a read voltage (of about 4V), thereby causing the select gate transistors S1, S2 and those transistors of non-selected memory cells MC0, MC2, . . . , MCi to turn on. Additionally, set the bit line BL at 1V, and set the source line CELSRC at 0V, by way of example. At this time, in case "0" data is written into the selected memory cell MC1, this memory cell MC1 turns off; alternatively, in case "1" data is written in selected memory cell MC1, this memory cell MC1 turns on. In view of this, detecting or sensing a current that flows in the bit line BL enables determination of "0" or "1." Regarding nonselected blocks, let all the control gates thereof be set in the floating state.

(4) Erase Verify Reading

Figure 3D:
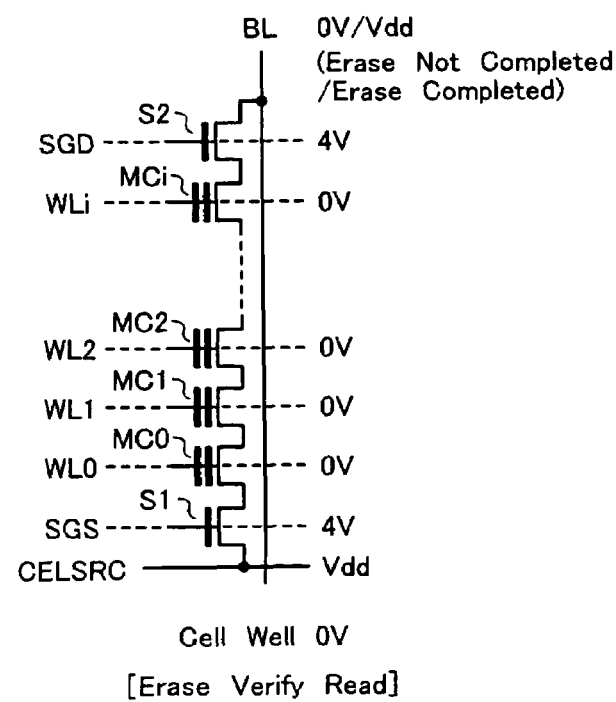

FIG. 3D shows the criteria for voltage application at the time of erase verify read of the NAND cell unit NU. An example shown herein assumes the block "BLK" is selected for data read. Give either the middle-level voltage VppM or the supply voltage Vdd from the source line CELSRC while giving ground potential to the bit line BL. Set all of the control gates within a selected block at 0V, and set the select gates SGS, SGD at the read voltage (of about 4V). Thereafter, read a voltage being charged to the bit line BL of interest to thereby determine whether the intended erase is completed (bitline BL is at Vdd) or not completed yet (BL is 0V). This erase verify read is achievable by utilizing the fact that a potential of the source line CELSRC is transferred up to the bitline BL because all the memory cells MC0 to MCi are rendered electrically conductive if all the memory cells MC0-MCi within the selected block are erased.

Regarding the control gates of nonselected blocks, let all of them be set in the floating state.

(5) Sub-Block Erasing

Figure 4A:
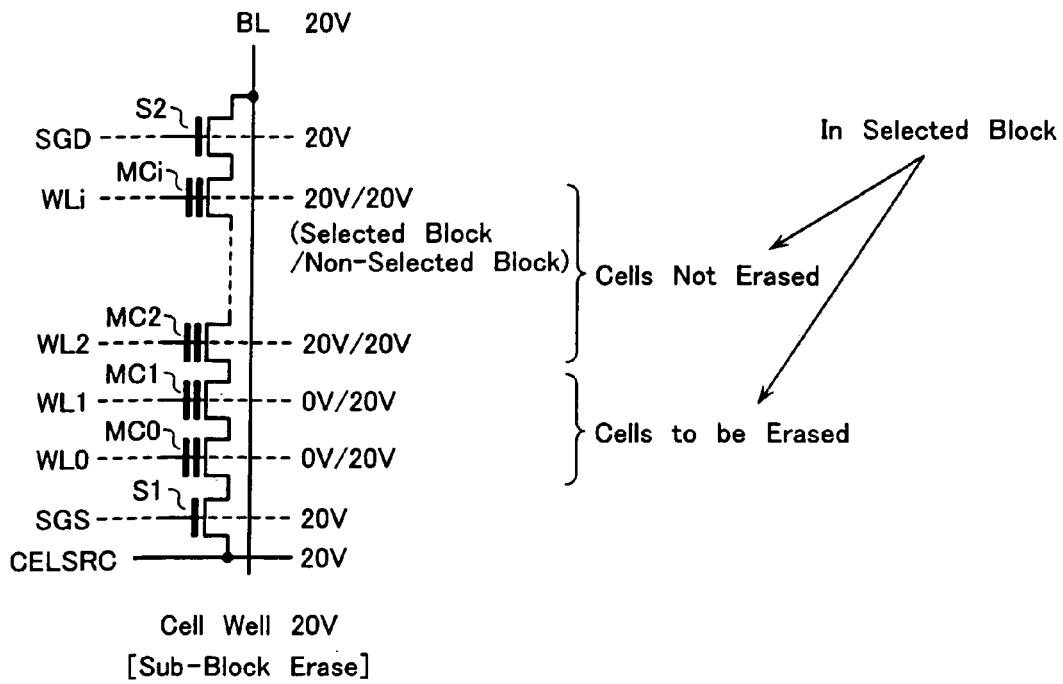
FIGS. 4A to 4C are diagrams showing voltage application patterns during sub-block erase, sub-block erase verify read, and over-program verify read of the flash memory, respectively.

FIG. 4A shows the criteria for voltage application at the time of sub-block erase of NAND cells. An example shown herein assumes that memory cells MC0 and MC1 are selected for erase. The sub-block erase is performed in a presently selected block. This sub-block erase includes the steps of: giving the ground potential to the control gates of the memory cells MC0 and MC1 to be erased, setting the control gates of the remaining memory cells MC2, . . . , MCi that are not subjected to erase in the floating state, setting in the floating state all the control gates within nonselected blocks and all the select gates and bit lines and source lines within all the NAND cell blocks, and then applying a high potential erase voltage (of about 20V) to a well region including the cells. Whereby, at the memory cells MC0–MC1 that are subjected to erase within the selected block, electrons of floating gates are drawn out toward the well so that erase is performed in units of selected control gate lines. At this time, all the control gates within nonselected blocks and all the select gates, bit lines and source lines within all the blocks increase in potential up to the erase voltage or its nearby potential levels due to the presence of capacitive coupling (e.g., in the case of a select gate line, the capacitive coupling of the gate capacitance of a select gate transistor and the capacitance between the select gate line and ground).

(6) Sub-Block Erase Verify Reading

Figure 4B:
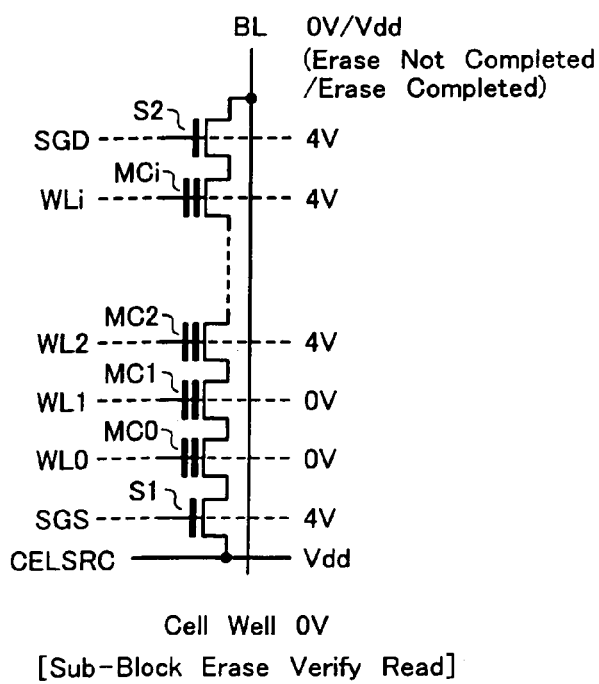

FIG. 4B shows the criteria for voltage application at the time of sub-block erase verify read of the NAND cell unit NU. An example shown herein assumes that memory cells MC0 and MC1 are selected for read. From the source line CELSRC, give the middle voltage VppM or supply voltage Vdd while giving ground potential to the bit line BL. Within the selected block, let the control gates of the memory cells MC0–MC1 that have been erased be set at ground potential; let the control gates of the other memory cells MC2, MC3, . . . , MCi that have not been subjected to erasing be set at a potential equivalent to the read voltage (of about 4V); and, set the select gates SGD, SGS at the read voltage (about 4V). Thereafter, read a voltage being charged to the bit line BL, thereby to determine whether the intended erase is completed (BL is at Vdd) or not (BL is 0V). A memory cell which was not erased yet is such that the read voltage is being applied to its control gate; thus, this cell is rendered conductive. Regarding a memory cell that has already been erased, this cell is electrically conductive if the erase is completed. Accordingly, the sub-block erase verify read scheme utilizes the fact that the potential of source line CELSRC is passed to the bit line BL as far as the sub-block erase is completed. Additionally, all the control gate lines of nonselected blocks are in the floating state.

(7) Over-program Verify Reading

Figure 4C:
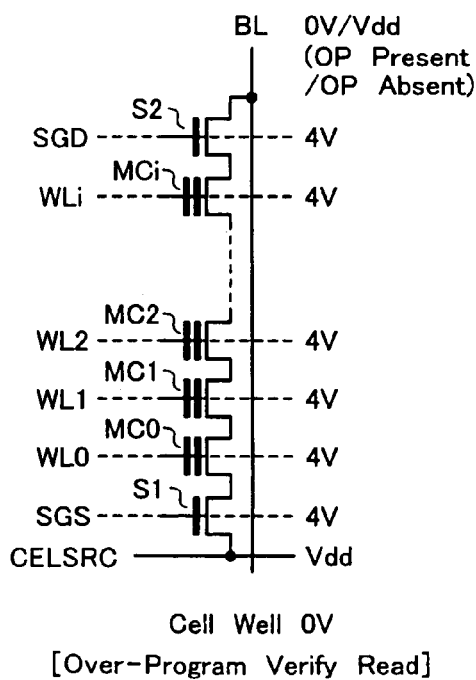

FIG. 4C shows the criteria for voltage application at the time of performing over-program verify read of the NAND cell unit NU. From the source line CELSRC, give either the middle voltage VppM or supply voltage Vdd, with ground potential applied to the bit line BL. Give the read voltage (about 4V) to all the control gates within a selected block while letting the select gates SGS, SGD be set at the read voltage (about 4V). Thereafter, detecting a voltage being charged to the bitline BL to thereby determine or "judge" whether a cell with its threshold voltage higher than the read voltage Vread is present (bitline BL is at 0V) or absent (bitline BL is Vdd). This over-program verify scheme utilizes the fact that if the threshold voltage of every memory cell within the selected block is potentially lower than the read voltage then every memory cell is rendered conductive (i.e. turns on) so that the potential of source line CELSRC is passed to the bit line BL. Additionally the control gates of nonselected blocks are all set in the floating state.

An explanation will next be given of a sub-block erase operation and its associative verify read operation, which are executed by the logic controller 6, sequence controller 7 and high voltage generator circuit 8 of this NAND flash memory.

[First Embodiment]

Figure 5:
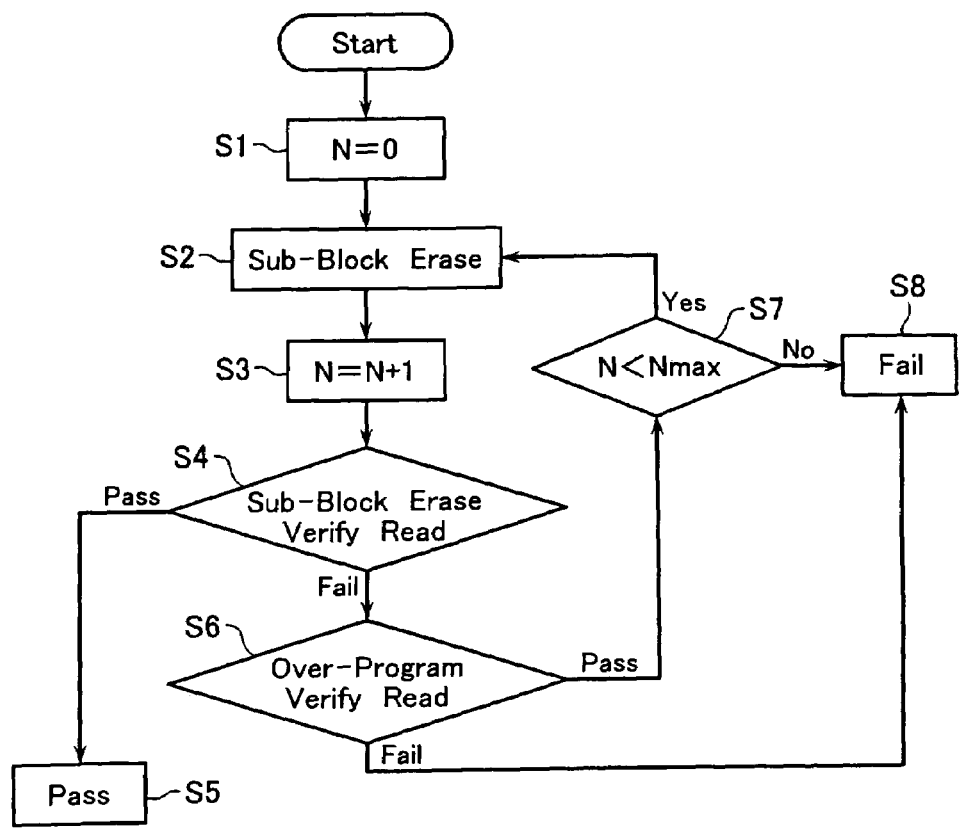
FIG. 5 is a flow chart of sub-block erase and its verify read procedure in accordance with a first embodiment of this invention.

FIG. 5 is a flow chart showing a sub-block erase operation and its following verify read operation in accordance with a first embodiment of the present invention.

Firstly, after the sub-block erasing is get started, the number of times that sub-block erase is executed—say, sub-block erase execution number N—is set at zero (0) at step S1 of FIG. 5. Then, sub-block erase is executed at step S2. Thereafter, the number is updated to N=1 at step S3. Next at step S4, the sub-block erase verify read shown in FIG. 4B is executed. If the result of such sub-block erase verify read indicates that the intended sub-block erase is completed (Pass), then go to step S5 which terminates the sub-block erase. Alternatively, if the sub-block erase is not completed (Fail), then simply repeat the sub-block erase. This is a standard procedure as employed in conventional methods. However, in this case, as stated previously, two possibilities are considered: one possibility is that the cell to be erased is not erased yet; and the other possibility is that an over-programmed cell or cells is/are present in a NAND cell unit to which the erased cell belongs.

In view of the above, the first embodiment of FIG. 5 is specifically arranged so that if a result of the sub-block erase verify read at step S4 indicates that the intended sub-block erase is not fully completed yet (that is, if Fail at step S4), then go to step S6 which further performs the over-program verify read operation shown in FIG. 4C to thereby determine whether the cause that the sub-block erase-verify result is flagged with Fail is based on the failure to completely erase the cell to be erased or alternatively the presence of a cell with its threshold voltage Vth higher than Vread—namely, over-programmed cell—within the NAND cell unit to which the to-be-erased cell belongs. If a result of over-program verify read indicates Pass, then this means that the intended sub-block erase remains incomplete. Thus, if Pass at step S6 then go next to step S7, which determines whether the erase execution number N is less than a prespecified value Nmax indicative of an allowable erase repeat number of the sub-block erase. If Yes at step S7, then return to sub-block erase step S2 which repeats execution of the above-stated operation. If No at step S7, that is, when N reaches Nmax, go to step S8 which outputs a result indicative of the failure to successfully complete the sub-block erase required and then forces the operation to expire.

Alternatively when the over-program verify read is found failed, that is, if Fail at step S6, this means that at least one cell (over-programmed cell) with its threshold voltage Vth higher than Vread must be present among the cells that are not to be erased. This in turn suggests that any further execution of sub-block erase does not result in successful completion of the intended erase operation. Accordingly, if this is the case then proceed to step S8 which outputs a result indicating that the sub-block erase is not performed and then terminates the operation.

In the case of this embodiment, performing the over-program verify read in the sequence of sub-block erase verify sessions makes it possible to analyze the exact cause that brings the determination that the sub-block erase is uncompleted. This in turn makes it possible to determine whether the sub-block erase can be continuously carried out thereafter. Thus it becomes possible to detect whether a memory cell that was excessively written or "over-programmed" to have its threshold voltage Vth higher than expected is present or not, thereby making it possible to shorten the sub-block erase time period (erase loop execution number). It is thus possible to reduce the number of times for application of the high potential erase voltage to the NAND flash memory. As a result, it is possible to preclude or at least greatly suppress unwanted occurrence of excessive erase or "over-erase" of the cell to be erased. This in turn makes it possible to narrow the threshold voltage distribution of such cell.

It should be noted that a time required for the over-program verify read is similar in length to the time as taken to perform the sub-block erase verify read. However, comparing it to the sub-block erase time period, the time required is sufficiently shorter (about 1/100). In view of this fact, adding the over-program verify read-process hardly results in a decrease in performance of the chip in any way.

[Second Embodiment]

Figure 6:
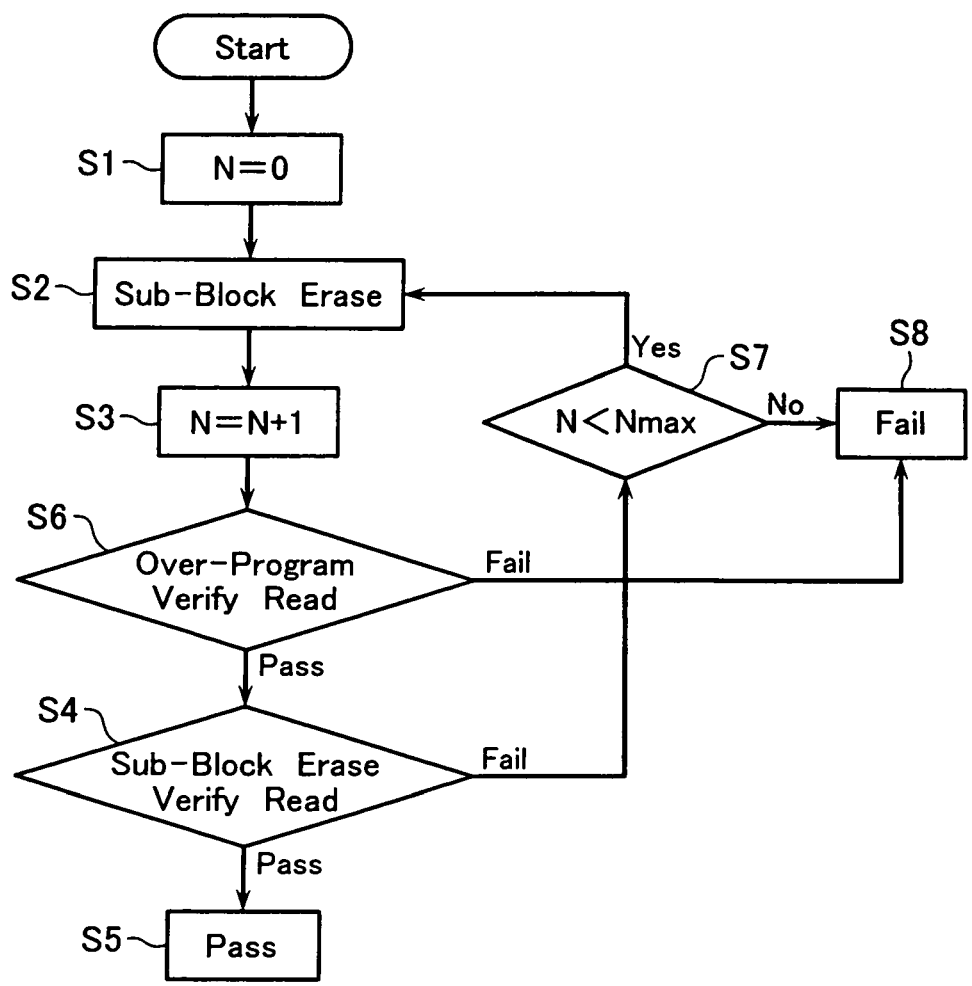
FIG. 6 is a flow chart of sub-block erase and its verify read procedure in accordance with a second embodiment of the invention.

FIG. 6 is a flow chart showing a procedure including sub-block erase and its verify read in accordance with a second embodiment of the invention.

A difference of the second embodiment from the first embodiment shown in FIG. 5 lies in the order of sequence for execution of the sub-block erase verify read (S4) and the over-program verify read (S6). More specifically, the second embodiment of FIG. 6 is arranged to execute the sub-block erase (S2) and, after having updated the number N, perform the over-program verify read (S6) and, thereafter, performs the sub-block erase verify read (S4).

By performing the over-program verify read prior to the sub-block erase verify read, it is possible to determine or judge whether a memory cell incapable of continuing any further sub-block erase is present or not, prior to actual execution of the sub-block erase verify read.

In case a result of the over-program verify read indicates Pass, perform the sub-block erase verify read. In the case of Fail, output a result indicating that the sub-block erase cannot be done and then terminate the operation (S8). This is because in the Fail event, execution of any further sub-block erase verify read sessions can no longer lead to any successful completion of the intended erase process.

Thus, in case the over-program verify read is Fail, it is possible to avoid any unnecessary sub-block erase verify read sessions. Additionally, the output result of the sub-block erase verify read as performed after the over-program verify read means the completion of the sub-block erase in the case of Pass; alternatively in the case of Fail, the result is expected to mean only incompleteness of the sub-block erase. Thus it is possible to obtain an accuracy-enhanced investigation result from the sub-block erase verify read result.

[Third Embodiment]

Figure 7:
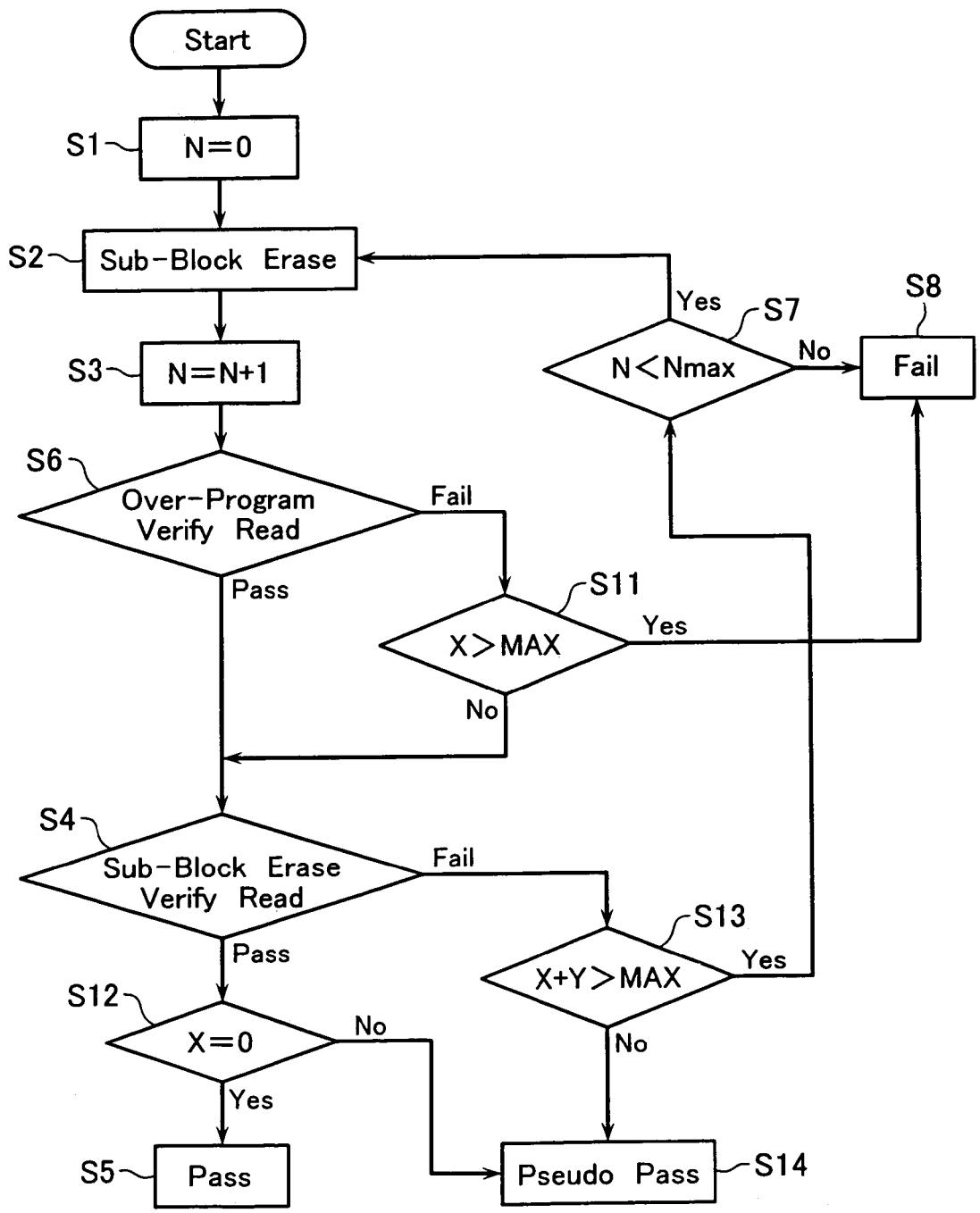
FIG. 7 is a flowchart of sub-block erase and its verify read procedure in accordance with a third embodiment of the invention.

FIG. 7 is a flowchart showing a procedure including sub-block erase and its verify read in accordance with a third embodiment of the invention. This third embodiment is a modified version of the second embodiment stated supra. This embodiment of FIG. 7 is different from the FIG. 6 embodiment in three points which follow.

(1) When any one of the over-program verify read or the sub-block erase verify read is failed (Fail), count up a number of bits of those memory cells being presently flagged with Fail (i.e., a number of bit lines).

(2) While letting the bit number (Fail bit number) of error-correctable memory cells be a permissible upper limit value (MAX) in an error correction circuit (not depicted) external to the chip, if the Fail bit number is less than or equal to the allowable upper limit value, then regard it as a virtual path, called the Pseudo-Pass, and next exit from the sub-block erase routine.

(3) In case one or a plurality, X, of Fail bits are found in the over-program verify read, setting is done in such a way that the corresponding X memory cells are forcibly Fail-output from read circuitry during sub-block erase verify read—in other words, these cells are forced to be excluded from the objects to be verified.

In the routine of FIG. 7, after having done a sub-block erase operation (at step S2), in case X failed bits flagged with Fail are obtained during over-program verify reading (S6), if X is not greater than the value MAX (S11), then perform sub-block erase verify read (S4). If X exceeds MAX then output Fail and next terminate the operation (S8). At the sub-block erase verify read step (S4), if no Fail bits are found (Y=0) then output, only in the above case of X=0, a result indicating intrinsic or "true" sub-block erase completion (Pass), followed by termination of the operation (S5). At the sub-block erase verify read (S4), in case the Fail bit number is Y, and if a value X+Y is less than or equal to MAX (S13), then output a Pseudo-Pass result indicative of virtual completion of the sub-block erase, followed by termination of the operation (S14). When X+Y is in excess of MAX, and if the erase execution number N does not reach the upper limit Nmax (S7) then repeat the sub-block erase (S2). When the erase number N reaches Nmax (S7), output a result (Fail) indicating that the sub-block erase is no longer completable and next terminate the operation (S8).

As apparent from the foregoing, this embodiment is arranged to count up the Fail bit number and perform the processing, under an assumption of the use of either an external error correction circuit or a chip-embedded error correction circuit, in a way which follows: as far as the Fail bit number stays less than or equal to the allowable upper limit value with failed-bit correctability, if the erase execution number N does not reach Nmax, then continue execution of the sub-block erase; if the erase number N reaches Nmax then set the pseudo-pass and next terminate the sub-block erase session. For example, assume that one page of information consists of 528 bits of data. Suppose that Bose-Chaudhuri-Hocquenghem (BCH) coding scheme is used. If this is the case, making use of 21 bits of test data makes it possible to achieve 2-bit error correction and 3-bit error detection. Accordingly, 21 bits of redundant bits in addition to 528 bits of information may be stored in the cell array 1 as extra bits.

With such an arrangement, even when one or more Fail bits are present, it is possible to perform the sub-block erase required. Even in cases where the sub-block erase verify read is ended with Fail, it is still possible to continue without interruption any subsequent processing while justifiably assuming that the sub-block erase is completed, as far as the Fail bit number of the over-program verify read and that of the sub-block erase verify read fall within a permissible or tolerance range with error correcting capabilities. Optionally, a block of the corresponding data may be handled as a defective block, the data of which is then moved to another appropriate block. With the third embodiment, it becomes possible to reduce in number any possible defective blocks, to thereby enable effective use of the memory region.

In this way, with regard to the read (sub-block erase verify read) operation for investigation of whether the intended sub-block erase of the NAND flash memory is successfully completed or not, adding a specific step of performing over-program verify read between the step of performing a sub-block erase operation and the step of doing a sub-block erase verify read operation makes it possible to detect whether any over-programmed memory cell with its threshold voltage Vth higher than expected is present or not. As a result, it is possible to shorten the sub-block erase time duration (erase loop execution number) to thereby enable reduction, in number, of the steps of applying the potentially increased erase voltage to the NAND flash memory. This in turn makes it possible to avoid excessive erase or over-erasure of the cell to be erased, thereby enabling the cell to be narrowed in width of threshold voltage distribution.

In addition, even when a failed memory cell is found during the over-program verify read session, such cell is permissible to act as a properly workable cell as far as its resultant number of bits is less than or equal to the permissible level, which is predefined and preset in external error correction circuitry operatively associated with the flash memory. Regarding a failed memory cell as found through an over-program-verify test, let it be excluded from the objects to be verified during sub-block erase verify read session to thereby make it possible to shorten the sub-block erase time period (erase loop execution number). This in turn makes it possible to reduce the number of times for application of the high-potential erase voltage to the NAND flash memory. Thus it is possible to prevent the to-be-erased cell from being over-erased unintentionally, thereby making it possible to narrow the resultant threshold voltage distribution of such cell. It is also possible to suppress or minimize occurrence of defective blocks to thereby enable effective use of the memory cell region.

Additionally, when the number of failed memory cells that are found by the over-program verify is greater than the permissible level of the external error correction circuitry, the operation is forced to interrupt. This makes it possible to omit and save the sub-block erase verify read time period, thus enabling acceleration of the operation.

It should be noted that the sense amplifier circuit 3 is modifiable to include a storage data retaining circuit (SRAM latch or dynamic capacitor), for making this storage hold circuit store therein the over-program verify read and sub-block erase verify read results. In this case, this circuit is designed to apply appropriate logical processing to these read results and then output, based a processing result, a specific electrical signal indicating that failed memory cells as found by over-program verify tests have passed the sub-block erase verify read test.

Also note that in view of the fact that the sub-block erase verify read and the over-program verify read are similar to each other in biasing conditions or criteria used, it is possible to perform these operations consecutively or "seamlessly," merely by changing the voltage potential of a word line of a memory cell or cells to be erased. Whereby, it is possible to lessen a total sum of the over-program verify read time and the sub-block erase verify read time, thus making it possible to speed up the operation.

It must be noted that the present invention is also applicable to other types of memory chips with their memory cells formed of semiconductor devices of the metal oxide nitride oxide semiconductor (MONOS) type or of the silicon oxide nitride oxide silicon (SONOS) type, wherein a gate insulation layer between a channel region and a control gate is structured from a multilayer film of a silicon oxide layer and a nitride silicon layer with electrical charge being trapped on the nitride silicon layer (for use as a charge accumulation layer).

As an embodiment, an electric card using the non-volatile semiconductor memory devices according to the above-described embodiments 1–3 of the present invention and an electric device using the card will be described bellow.

Figure 8:
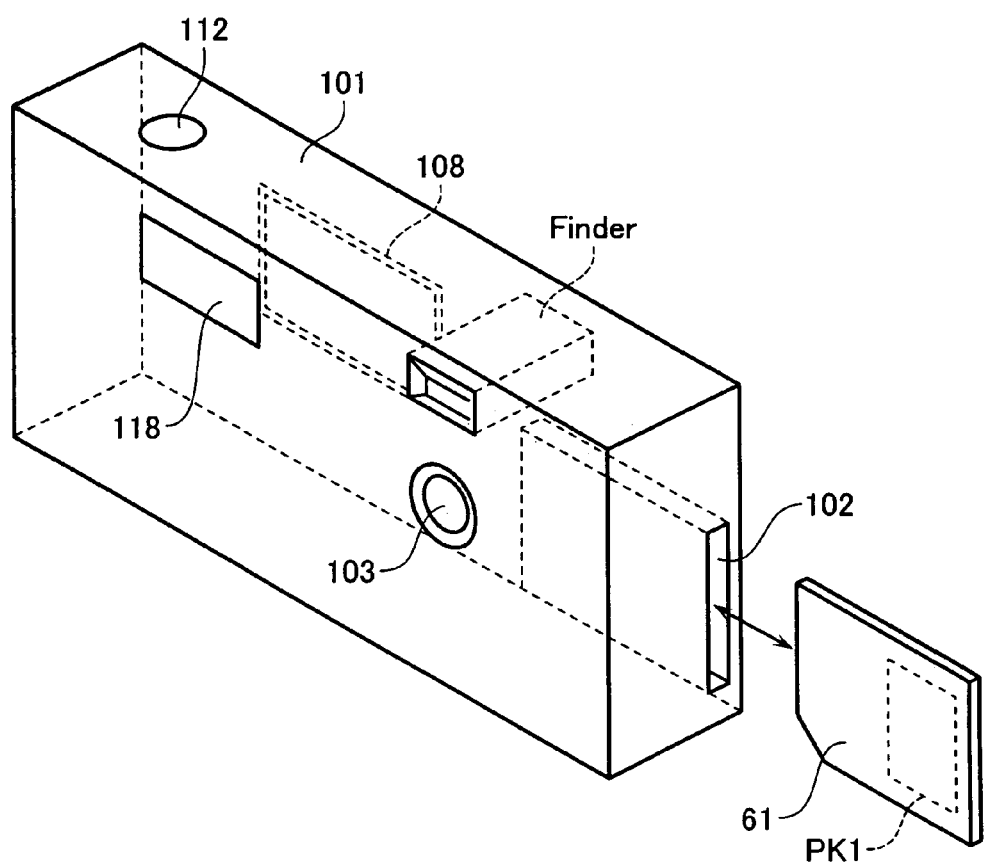
FIG. 8 shows another embodiment applied to a digital still camera.

FIG. 8 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 9:
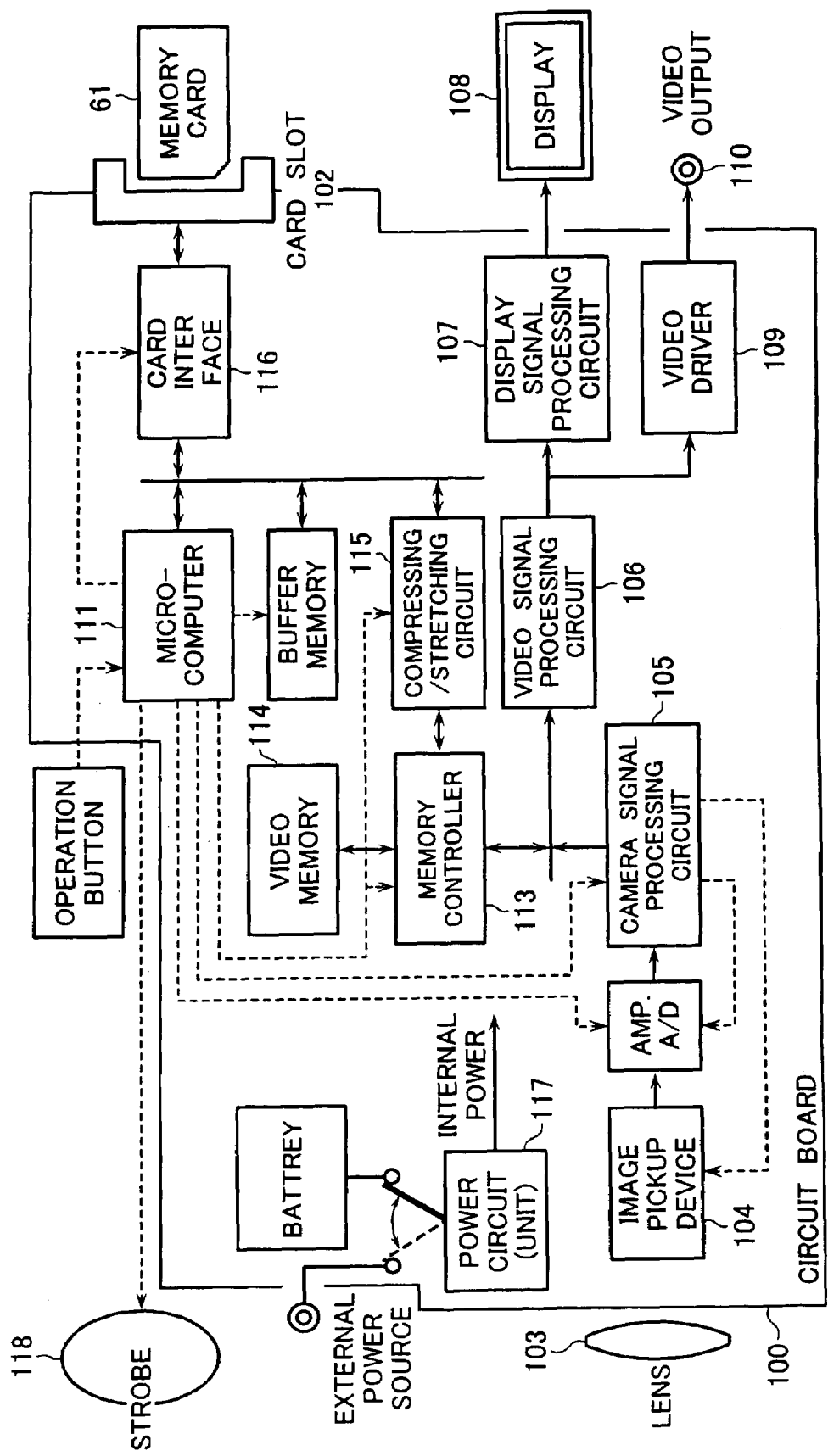
FIG. 9 shows an internal configuration of the digital still camera.
Figure 10A:
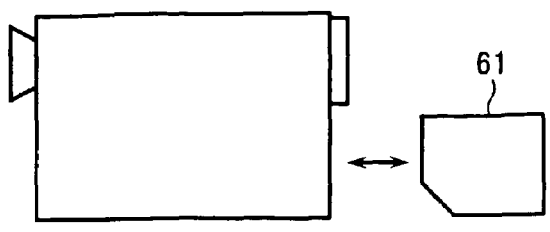
FIGS. 10A to 10J show other electric devices to which the embodiment is applied.
Figure 10F:
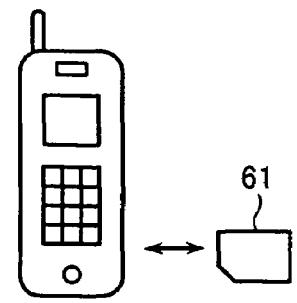
Figure 10B:
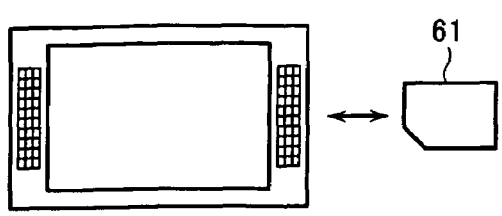
Figure 10G:
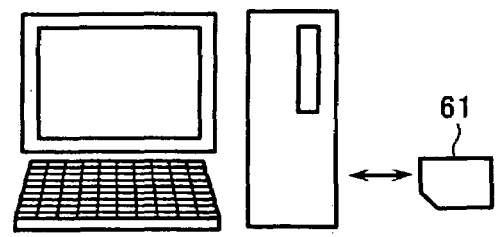
Figure 10C:
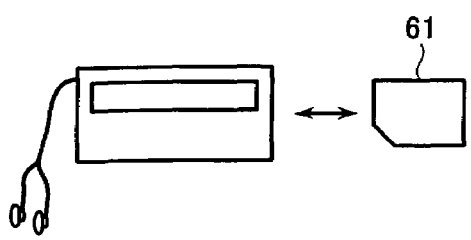
Figure 10H:
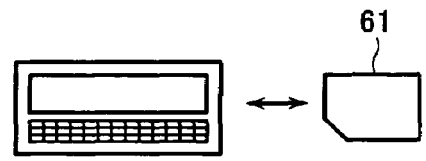
Figure 10D:
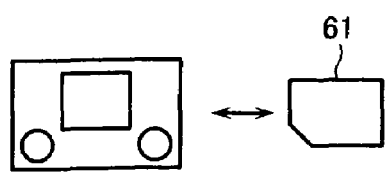
Figure 10I:
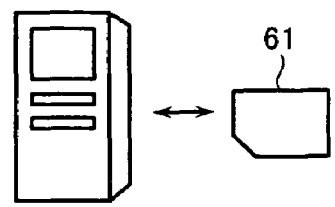
Figure 10E:
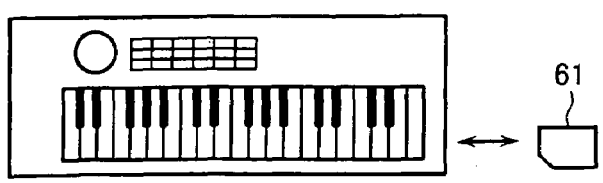
Figure 10J:
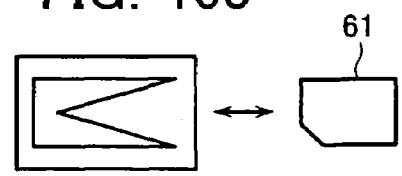
Figure 11:
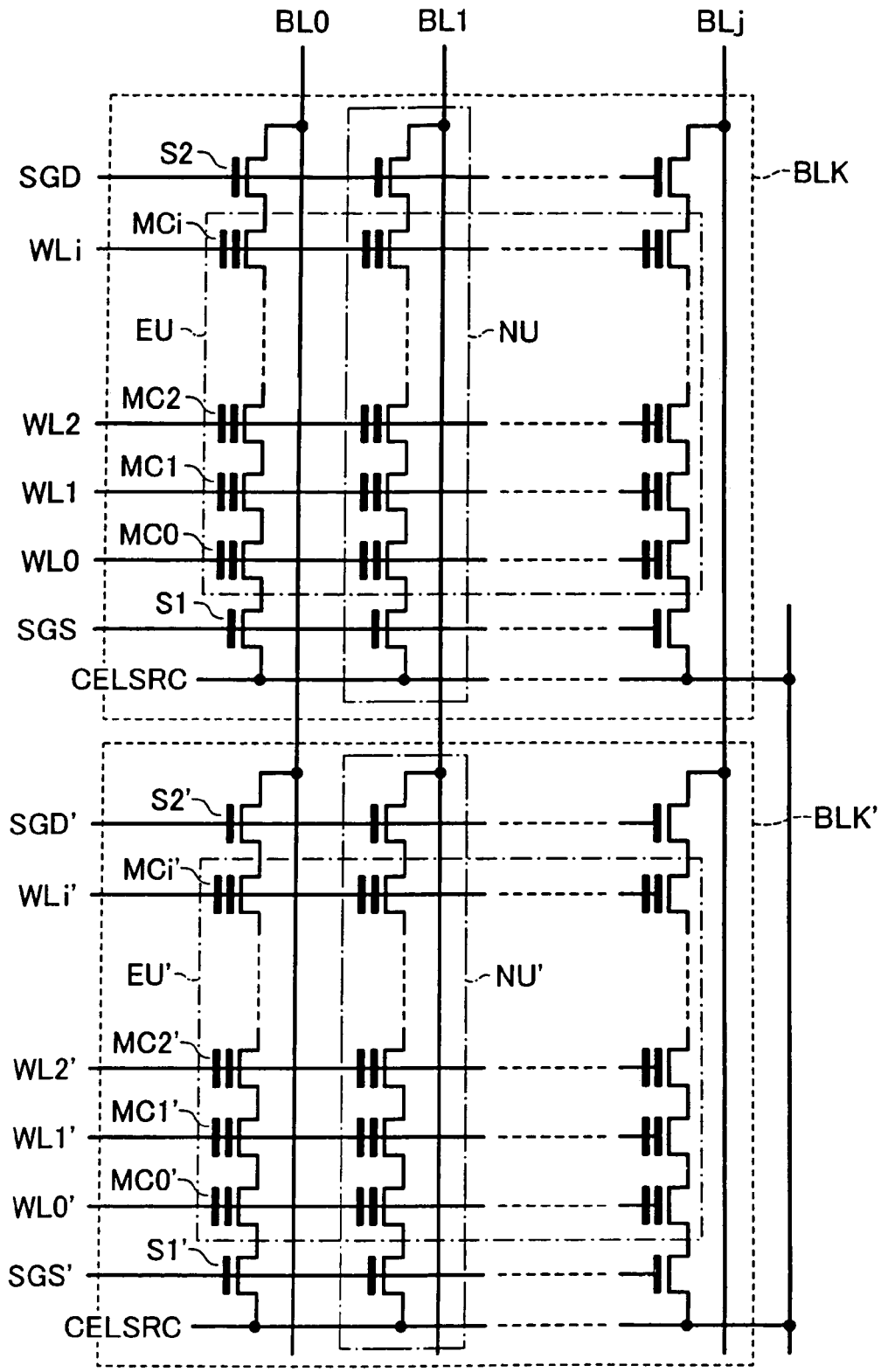
FIG. 11 shows a configuration of part of the memory cell array of a NAND-type flash memory.
Figure 12A:
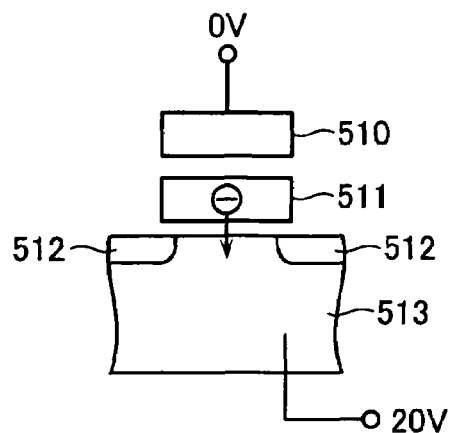
FIGS. 12A and 12B depict cross-sectional structures of a single memory cell MC of the NAND flash memory.
Figure 12B:
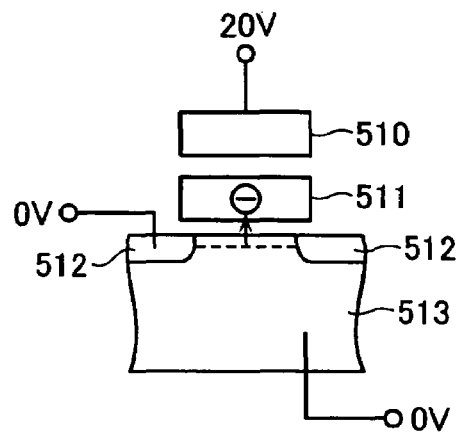
Figure 12C:
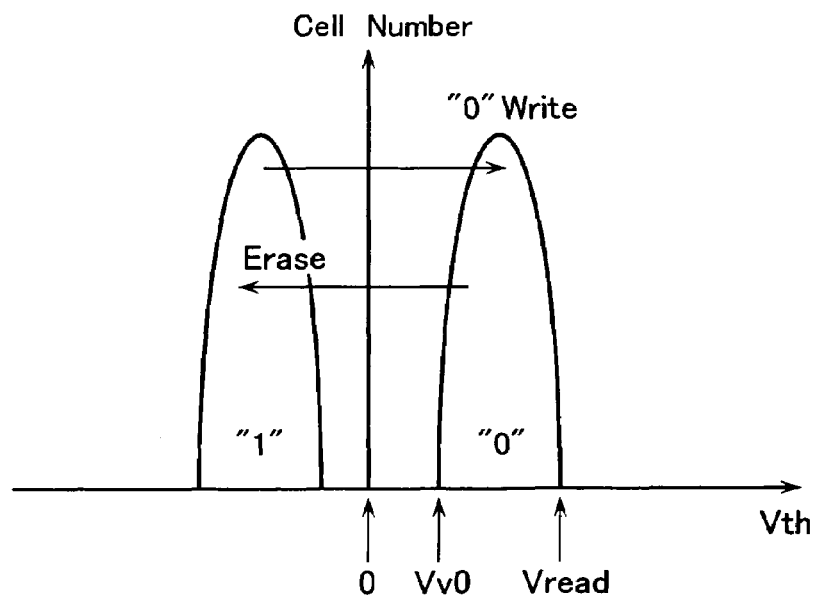
FIG. 12C is a graph showing a threshold voltage distribution pattern thereof.

FIG. 9 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116. The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 10A to 10J, as well as in portable electric devices. That is, the electric card can also be used in a video camera shown in FIG. 10A, a television set shown in FIG. 10B, an audio apparatus shown in FIG. 10C, a game apparatus shown in FIG. 10D, an electric musical instrument shown in FIG. 10E, a cell phone shown in FIG. 10F, a personal computer shown in FIG. 10G, a personal digital assistant (PDA) shown in FIG. 10H, a voice recorder shown in FIG. 10I, and a PC card shown in FIG. 10J.

What is claimed is:

1. A sub-block erase method of a non-volatile semiconductor memory device including a matrix of rows and columns of memory cells organized into more than one cell array block, each said memory cell has a charge storage layer, said method being for erasing more than one partial memory cell of said cell array block, said method comprising:
   performing sub-block erase by giving a voltage to said partial memory cell;
   performing sub-block erase verify read to check whether said memory cell is set in the erase state;
   performing over-program verify read to check whether an memory cell having its threshold voltage higher than a read voltage;
   determining the erase is inexecutable to thereby terminate the processing when an over-programmed memory cell is found to be present by said over-program verify read;
   counting a number of cell units, each comprising a plurality of said memory cells queued in a column direction, each being determined by said over-program verify read to include therein an over-programmed memory cell; and
   continuing the processing without rendering the erase inexecutable when the number as counted at this step is less than or equal to an error correctable number.

2. A sub-block erase method of a non-volatile semiconductor memory device including a matrix of rows and columns of memory cells organized into more than one cell array block, each said memory cell has a charge storage layer, said method being for erasing more than one partial memory cell of said cell array block, said method comprising:
   performing sub-block erase by giving a voltage to said partial memory cell;
   performing sub-block erase verify read to check whether said memory cell is set in the erase state;
   performing over-program verify read to check whether an memory cell having its threshold voltage higher than a read voltage;
   determining the erase is inexecutable to thereby terminate the Processing when an over-programmed memory cell is found to be present by said over-program verify read;
   counting a number of cell units, each comprised by a plurality of said memory cells queued in a column direction, each being determined by said over-program verify read to include therein an over-programmed memory cell;
   counting a number of cell units being determined by said sub-block erase verify read to be incomplete in erase; and
   virtually determining the erase is completed to thereby terminate the processing when a sum of these count values is less than or equal to an error correctable number.

3. A sub-block erase method of a non-volatile semiconductor memory device including a matrix of rows and columns of memory cells organized into more than one cell array block, each said memory cell has a charge storage layer, said method being for erasing more than one partial, memory cell of said cell array block, said method comprising:
   performing sub-block erase by giving a voltage to said partial memory cell;
   performing sub-block erase verify read to check whether said memory cell is set in the erase state;
   performing over-program verify read to check whether an memory cell having its threshold voltage higher than a read voltage;
   determining the erase is inexecutable to thereby terminate the processing when an over-programmed memory cell is found to be present by said over-program verify read;
   wherein the threshold voltage of said memory cell becomes a first threshold voltage higher than a ground potential and yet lower than the read voltage in the write state and is a second threshold voltage lower than the ground potential in the erase state,
   said sub-block erase is done by giving the ground potential to a control gate of the memory cell to be erased and letting the bit line and control gates of memory cells other than the cell being erased be in an electrically floating state and then applying a high voltage to the semiconductor substrate,
   said over-program verify read is done by applying the read voltage to the control gates of all the memory cells, and
   said sub-block erase verify read is done by applying the ground potential to the control gate of the memory cell to be erased while applying the read voltage to the control gates of the other memory cells.

4. A sub-block erase method of a non-volatile semiconductor memory device including a matrix of rows and columns of memory cells organized into more than one cell array block, each said memory cell has a charge storage layer, said method being for erasing more than one partial memory cell of said cell array block, said method comprising:

performing sub-block erase by giving a voltage to said partial memory cell;

performing sub-block erase verify read to check whether said memory cell is set in the erase state;

performing over-program verify read to check whether an memory cell having its threshold voltage higher than a read voltage;

determining the erase is inexecutable to thereby terminate the processing when an over-programmed memory cell is found to be present by said over-program verify read;

wherein said over-program verify read and said sub-block erase verify read are continuously executed by changing an applied voltage to the control gate of the memory cell to be erased.

5. A nonvolatile semiconductor memory device comprising:

a memory cell array with a matrix of rows and columns of memory cells organized into more than one cell array block, each said memory cell has a charge storage layer; and a controller which applies to this memory cell array certain voltages for execution of write and read of said memory cell;

said controller configured to perform sub-block erase for erasing more than one partial memory cell of said cell array block by giving a voltage to said partial memory cell, performs sub-block erase verify read to check whether said memory cell is set in the erase state, to perform over-program verify read to check whether an memory cell having its threshold voltage higher than a read voltage, and to determine the erase is inexecutable to thereby terminate the processing when an over-programmed memory cell is found to be present by said over-program verily read.

6. An electric card equipped with a non-volatile semiconductor memory device defined in claim 5.

7. An electric device comprising;

a card interface;

a card slot connected to said card interface; and, an electric card as defined in claim 6 and electrically connectable to said card slot.

8. The electric device according to claim 7, wherein said electric device is a digital still camera.

* * * * *